United States Patent [19]

Trumper

[11] Patent Number: 5,294,854
[45] Date of Patent: Mar. 15, 1994

[54] BEARING FOR USE IN HIGH RESOLUTION PRECISION CONTROL DEVICE

[75] Inventor: David L. Trumper, Concord, N.C.

[73] Assignee: Massachusetts Institute of Tech., Cambridge, Mass.

[21] Appl. No.: 871,924

[22] Filed: Apr. 22, 1992

Related U.S. Application Data

[62] Division of Ser. No. 632,965, Dec. 20, 1990, Pat. No. 5,157,296.

[51] Int. Cl.$^5$ .......................... H02K 7/09; G05B 13/02
[52] U.S. Cl. .................................... 310/90.5; 310/181; 318/592
[58] Field of Search ................. 310/90.5, 181; 384/12, 384/133; 318/592

[56] References Cited

U.S. PATENT DOCUMENTS

| | | | |
|---|---|---|---|
| 1,589,039 | 6/1926 | Anshutz-Kaempfe | 310/90.5 |
| 3,845,996 | 11/1974 | Geweke | 310/90.5 |
| 4,475,033 | 10/1984 | Willemsen et al. | 250/227 |
| 4,644,205 | 2/1987 | Sudo et al. | 310/90.5 |
| 4,700,094 | 10/1987 | Downer et al. | 310/90.5 |
| 4,841,204 | 6/1989 | Studer | 318/254 |
| 4,874,998 | 10/1989 | Hollis, Jr. | 318/568.21 |
| 4,947,067 | 8/1990 | Habermann et al. | 310/51 |
| 4,991,438 | 2/1991 | Evans | 73/516 R |
| 5,157,296 | 10/1992 | Trumper | 310/90.5 |

Primary Examiner—R. Skudy
Assistant Examiner—D. R. Haszko
Attorney, Agent, or Firm—Wolf, Greenfield & Sacks

[57] ABSTRACT

A magnetic bearing is provided which may be utilized in a fine position control or movement system. Stability is enhanced by providing separate mechanisms for supporting the weight of a platen or other object being controlled with electromagnets utilized to control or compensate for motion of the platen in N degrees of freedom. The support mechanism is preferably one or more permanent magnets having an air gap with the platen which is greater than the air gap for the electromagnets. The mechanisms for supporting the weight of the platen may be made adjustable so as to support the weight of the platen regardless of any changes in such weight by, for example, adjusting the air gap for the permanent magnet to compensate for weight changes. Resonant vibration is reduced by constructing the platen of a hollowed, cellular structure, for example, a honeycomb structure.

30 Claims, 8 Drawing Sheets

BEARING FOR USE IN HIGH RESOLUTION PRECISION CONTROL DEVICE

This invention was made with government support under contract Number F19628-90-C-0002 awarded by the Air Force. The government has certain rights in the invention.

This is a divisional of copending application Ser. No. 07/632,965 filed on Dec. 20, 1990, now U.S. Pat. No. 5,157,296.

FIELD OF THE INVENTION

This invention relates to position control devices and more particularly to a bearing for use in a high resolution device for precisely maintaining the position of an object or for precise small movements of an object.

BACKGROUND OF THE INVENTION

There are many applications where an object must be positioned with high precision in the nanometer range. Such applications include scanning tunneling microscopy, precision mechanically suspended linear slides and XY stages, such as those used in the manufacture of electronic circuit chips, various precision optical applications, and diamond turning machines. In such applications and others, the object must not only be precisely positioned, but the position must be maintained regardless of perturbations to the object resulting from air currents, vibration, temperature variations and the like. In some applications, such a fine position control mechanism may be used alone, while in other applications it may be used as a fine motion control stage in a mechanism which also includes a coarse motion control stage for positioning the device over larger distances with a lower degree of resolution.

While various bearings have been utilized in the past in such applications, including mechanical bearings, flexures, gas and liquid fluid bearings, etc., magnetic bearings have been found preferable for such applications for a number of reasons. Such bearings or suspensions have superior controllable stiffness, have less cross-coupling between modes with multiple degrees of freedom and are generally easier to control. They are not subject to rough spots, friction or wear as with mechanical bearings, and are also simpler to design mechanically, generally involving only a single moving part. However, while magnetic bearings offer a number of advantages, they also provide various control problems, particularly when operating with nanometer or Angstrom resolutions.

One approach to developing a magnetic bearing for fine motion control is discussed in an article entitled "Design Considerations for Ultra Precision Magnetic Bearing Supported Slides" by A. H. Slocum and D. B. Eisenhaure, NASA Magnetic Suspension Technology Conference, Hampton, VA Feb. 2–4, 1988. However, the device described in this paper had a number of limitations which adversely affect its performance.

First, while permanent magnets were used in this device to support the weight of the object or platen to be moved, the gap for the permanent magnet was substantially the same as the gaps for the electromagnets used for positioning the platen or maintaining the position thereof. These gaps were relatively small, in part because position sensing capacitive probes were mounted within the coils of the electromagnets. This results in a relatively large unstable frequency of suspension, thereby making the control problem far more difficult. One of the objects of this invention is to provide enhanced stability in a small motion system.

Another problem with the prior system is that it did not operate the electromagnets in push/pull mode in all dimensions and for all degrees of freedom. This inhibited the ability to correct for various errors and also reduced stability of the system. The control problem was also complicated by using magnet of different size. Other problems included mounting the probes in the electromagnets which increased the size, and thus the required currents, for the electromagnets and also restricted the gaps available for these magnets. Position sensing was also restricted to less than the full range of motion of the platen, resulting in instability when the platen moved outside the sensor range. Further, the platen was a hollow tube which exhibited significant resonance at one or more selected frequencies. It is desirable that the platen not be designed to permit such resonance.

The prior art system also was unable to compensate with the permanent magnet for variations in platen weight which might occur, for example, when a load was placed on the platen to have work performed thereon. Since enhanced stability and control is achieved, and electrical usage is minimized, where the platen weight is always being supported solely by the permanent magnet, regardless of changes in the weight of the platen, a need exists for a mechanism to permit the magnetic force of the permanent magnet exerted on the platen to be adjusted to achieve this objective.

In addition, it is desirable in some applications that the system be damped beyond the damping provided solely by the magnetic bearings. Since air provides little damping, such additional damping could be provided by suspending the platen in a viscous fluid, ferrofluid, or similar media for improving damping and high frequency coupling between the platen and a frame or housing in which the platen is mounted. Where such fluid is provided, it might also be utilized to carry the weight of the platen in lieu of or in addition to the permanent magnet and to adjust for weight changes of the platen. Where a ferrofluid is employed, it may also be utilized, in conjunction with the electromagnets, to control platen or object position in some or all degrees of freedom.

SUMMARY OF THE INVENTION

Thus, it is a primary object of this invention to provide an improved magnetic bearing suitable for use in a fine position control or movement system which affords high stability by supporting the weight of the platen or other object to be moved with a first means regardless of the weight of the platen, which utilizes separate electromagnets connected in push/pull fashion to control or compensate for motion of the platen in N degrees of freedom and which use detectors independent of the electromagnets to detect movement for effecting desired corrections. The first means for a preferred embodiment is a permanent magnet having a gap with the platen which is greater than that for the electromagnets.

More particularly, this invention provides a bearing which has a platen, a frame in which the platen is positioned and a mechanism for suspending the platen in a predetermined position in the frame. The suspension mechanism includes a permanent magnet having a first air gap or other suitable means for carrying the weight of the platen, and electromagnet means having a second air gap and preferably operated in push/pull fashion for controlling the position of the platen in the frame with N degrees (for example six degrees) of freedom. The first air gap is preferably larger than the second air gap. The suspension mechanism also includes detectors for the position of the platen in the frame in the N degrees of freedom and controls responsive to the detection by the detectors of a movement by the platen for selectively energizing the electromagnetic means to restore the platen to the predetermined position.

Where a load may be applied to the platen or removed from the platen, or the weight of the platen otherwise changed, the magnetic force exerted by the permanent magnet on the platen or the other means for carrying the weight of the platen, may be altered, preferably by altering the first air gap, to permit the permanent magnet or other means to carry the weight of the platen regardless of any changes in such weight. The adjusting is preferably accomplished by changing the air gap in response to the detection of a current applied to a weight supporting electromagnet to zero out such current and is preferably operative only for sustained currents to the weight supporting electromagnets.

A means may also be provided in at least selected ones of the air gaps to improve damping and high frequency coupling between the frame and platen. This damping element or means may, for example, be a viscous fluid or ferrofluid in at least the air gaps. Such fluid may also be utilized to support the weight of the platen, either in addition to or instead of the permanent magnet. Where ferrofluid is utilized, it may also be utilized in conjunction with the electromagnets to move the platen.

The permanent magnet may be a single permanent magnet which interacts with an iron bar, one of which is attached to the top of the platen and the other one of which is attached adjacent thereto to the frame. Either in addition to or instead of the permanent magnet operating in an attraction mode, two permanent magnets may be attached in repulsion mode, one to the bottom of the platen and the other adjacent thereto to the frame.

Where the position of the platen is controlled with L linear degrees of freedom and R rotational degrees of freedom, there would be at least one electromagnet for each linear degree of freedom and at least one additional electromagnet for each rotational degree of freedom. For a preferred embodiment, with L and R both equal to three, the electromagnet means includes at least one electromagnet for each of two opposite sides of the platen and at least two electromagnets for the remaining two sides of the platen, the electromagnets on each side being on opposite sides of a top/bottom center line for the side. At least four electromagnets are provided for the top of the platen and for the bottom of the platen, the four electromagnets for each of the top and bottom being in opposite quandrants thereof. Electromagnets on opposite sides are positioned opposite each other and all of the electromagnets are preferably identical so as to permit the electromagnets to operate in push/pull fashion. For each electromagnet, there is a corresponding iron insert embedded in the platen which is spaced from the electromagnet by the second gap. The iron inserts are preferably slightly larger than the corresponding electromagnets to permit constant magnetic coupling to be maintained over the full permitted range of movement of the platen in the frame and the electromagnets and iron inserts are preferably positioned near each end of each of the platen sides and near each corner of the platen top and platen bottom. Ferrofluid in the second gaps may be substituted for the iron inserts. Motion in a given degree of freedom may be achieved by selectively energizing one or more of the electromagnets.

The platen is preferably formed as a honeycomb, foamed or other hollowed out cellular structure of a material which is light, stiff, has a relatively low thermal expansion and has good damping characteristics. Such material would preferably be a composite material.

The detectors should include at least one detector probe for each of the degrees of freedom, the probes being mounted to the frame and spaced from the platen. At least one of the probes would be positioned to detect movement in each lateral direction of motion and at least two of the probes would be positioned to detect each of roll, pitch and yaw. The probes could be capacitive probes, optical interferometers, inductance probes or other suitable detectors.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1:
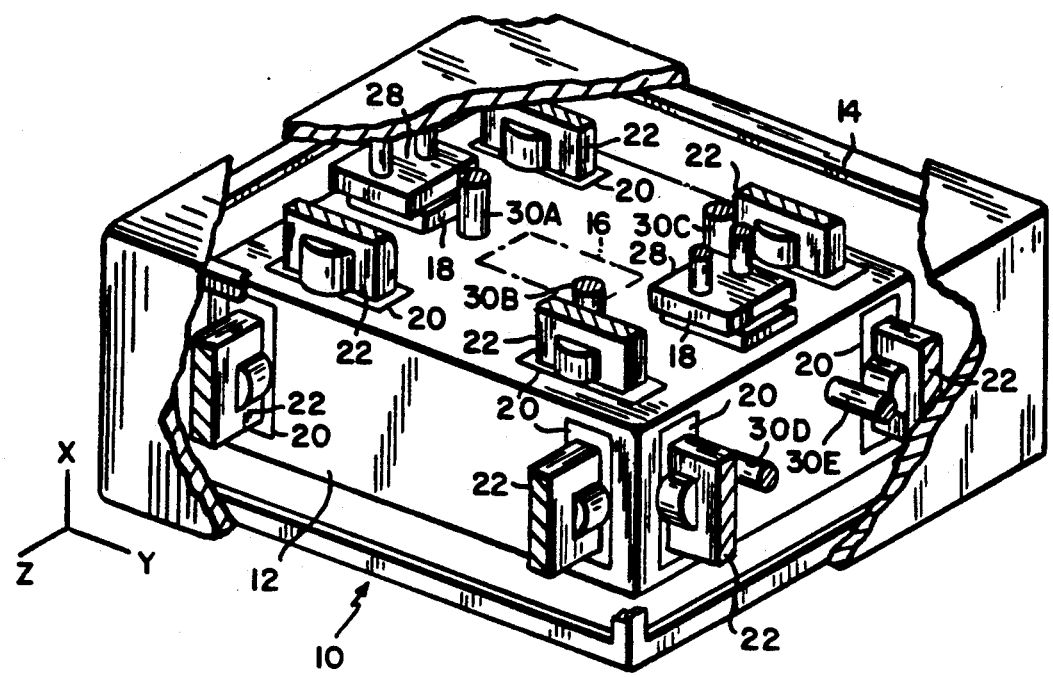
FIG. 1 is a partially broken away top-side perspective view of a bearing employing the teachings of this invention.
Figure 1A:
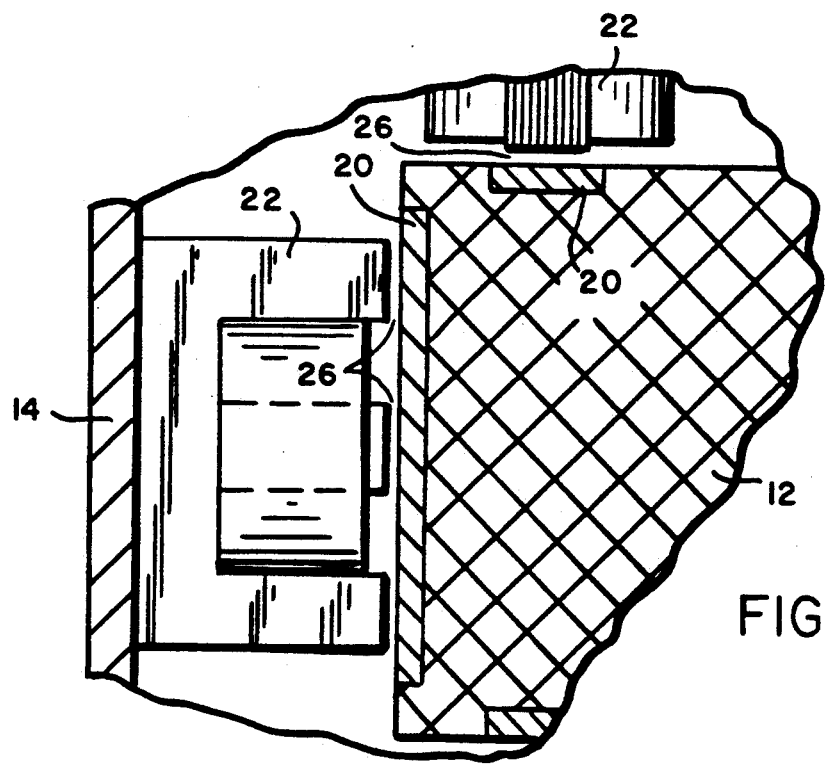
FIG. 1A is an enlarged cut-away side view of a portion of the bearing shown in FIG. 1.
Figure 2:
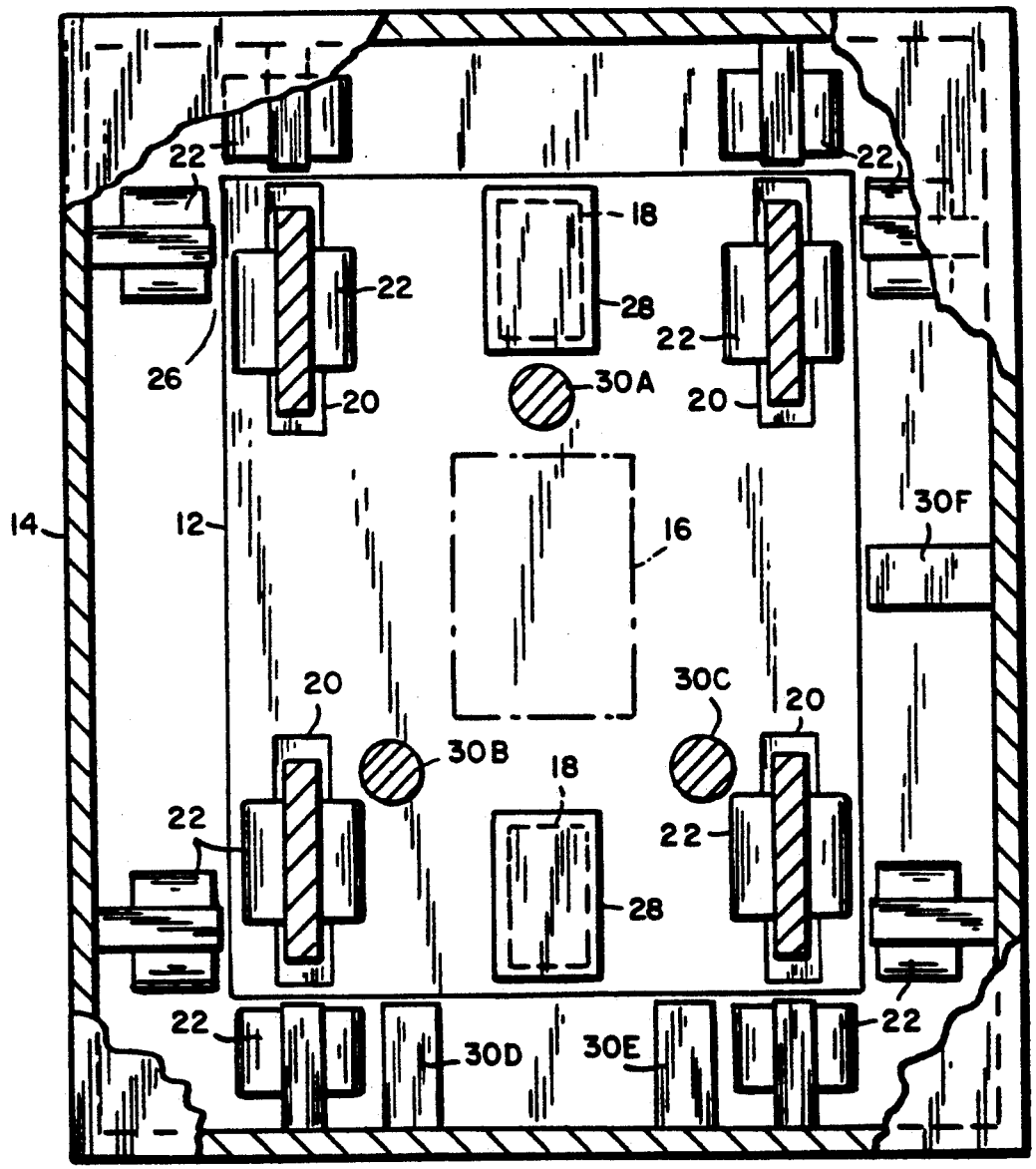
FIG. 2 is a partially broken away top view of the bearing shown in FIG. 1.

Referring to the figures, and in particular to FIGS. 1, 1A, and 2 which illustrate a first embodiment of the invention, the bearing 10 of this invention includes a platen 12 which is mounted in a frame 14. Platen 12 has a sample mounting or work area 16 on its top surface. A pair of permanent magnets 18 are affixed to the top surface of the platen at substantially the center near each end thereof. Magnets 18 may be secured to the platen by gluing or other suitable means. The platen also has iron inserts 20 embedded in it at a plurality of locations on each face of the platen. For the preferred embodiment shown in the figures, there is an iron insert 20 near each corner of the top and bottom faces or surfaces of the platen and an iron insert 20 near each end of each side of the platen. Iron inserts 20 are preferably laminar to avoid eddy currents and are thick enough to provide good magnetic coupling.

Platen 12 for the preferred embodiment has a solid rectangular shape which is preferable, but not essential, for permitting motion control in all dimensions. In order to avoid resonances, instead of the platen being a hollow tube structure as in some prior art devices, the platen is formed with a honeycomb structure which may be seen in the cutaway portion of FIG. 1A or with a foamed or other structure having hollowed out cells. Since the soft iron inserts 20 do not provide significant structural support, and it is desirable that the platen be as stiff as possible to avoid errors caused by bending thereof, the material for the platen should be as stiff as possible while still being light in weight and having good damping characteristics. Since the platen may be exposed to substantial temperature variations in operation, it is preferable that the material for the platen also have relatively low thermal expansion characteristics. Examples of materials suitable for this application include carbon fiber, various ceramics such as Zerodur ceramic or Invar metallic alloy.

Frame 14 may be a solid structure formed of a non-magnetic material and, for certain embodiments to be discussed hereinafter, at least a portion of the frame must be solid to retain fluid therein. Frame 14 can also be an open bar or panel structure, particularly on its top side, to permit access to the platen. There are also applications where the platen needs to be in a high pressure, low pressure or other sealed environment, in which case frame 14 would have walls which serve as the walls of such a sealed chamber.

An electromagnet 22 is mounted in frame 14 adjacent each of the iron inserts 20. For the preferred embodiment, all of the electromagnets 22 are identical and corresponding electromagnets adjacent opposite faces of platen 12 are directly opposite each other and operate in push/pull fashion to control the position of the platen. Each of the electromagnets 22 for the embodiment shown in the figures consists of an E-shaped iron core which is preferably laminated, having electrical wiring wrapped around its center section. The physical size and electrical power of the electromagnets will vary with application. Each iron insert 20 is sufficiently larger than the corresponding electromagnet 22 so that the electromagnet will have iron insert under all portions thereof for the full range of movement of the platen in the N directions or degrees of movement for the platen.

Each electromagnet 22 is spaced from the corresponding iron insert 20 by an air gap 26. As was previously discussed, the unstable natural frequency increases undesirably as current is increased for a fixed air gap, or as the air gap is decreased at fixed current. Conversely, the unstable natural frequency decreases desirably as current is decreased at fixed air gap or as the air gap is increased at fixed current. Thus, increasing the size of the air gaps to approximately 0.030 inches would make the suspension easier to control, and would also afford greater range of motion where the system is being utilized as a small motion controller. In other applications, the air gap could be larger or smaller as appropriate. However, if permanent magnets 18 are utilized, as will be discussed later, to carry the gravity load of platen 12, and the system is arranged so that all electromagnets 22 are in push/pull pairs, then the system can run at smaller air gaps with reduced bias currents. At small operating point currents, the suspension open-loop time constants can be made sufficiently large even with smaller air gaps. This allows for the efficiency of force production associated with small air gap while retaining the advantage of stable operation.

For each permanent magnet 18, there is an iron bar 28 mounted to frame 14, which bar is large enough so that it will always be over the entire magnet 18 through the full range of motion of platen 12. Each of the iron bars 28 is spaced from the corresponding magnet 18 by an air gap 29. For preferred embodiments of the invention, the air gap 29 is larger than the air gaps 26. This provides for stable operation afforded by larger permanent magnet air gaps while still providing the operating efficiency resulting from electromagnets operating at small air gaps.

Finally, a plurality of capacitive probes 30A-30F are mounted in frame 14. Each probe 30A-30F is spaced from platen 12 by an air gap which is dictated primarily by the range or sensitivity of the probe. There is a capacitive probe 30A-30F for each direction or degree of motion of concern for platen 12 with at least one of the capacitive probes 30A-30F being utilized to detect each linear degree of movement and at least two of the probes 30A-30F being utilized to detect each rotational degree of motion. Thus, the probes 30A, 30B and 30C all detect linear motion in the up/down direction, the X direction as shown in FIG. 1. Probes 30D and 30E detect motion in the forward or Y direction and probe 30F detects linear motion in the lateral or Z direction. Probes 30A, 30B and 30C also detect pitch motion of the platen (i.e. rotation about the Z axis), while probes 30B and 30C detect roll motion (rotation about the Y axis). Probes 30D and 30E can be utilized to detect yaw motion (i.e. rotation about the X axis).

While a particular arrangement of the probes 30 is shown in the figures, this arrangement is primarily for purposes of illustration and other arrangements are possible. For example, a probe may be provided adjacent each electromagnet 22 for the three faces having probes; and where two or more probes are provided for a single face, one or more of such probes may be on the opposite face. All that is required is that sufficient probes be provided to be able to detect each degree of motion of concern. Further, while capacitive probes have been shown in the figures for purposes of illustration, other probes known in the art, including optical interferometers and induction or eddy current probes, might also be utilized.

Figure 3:
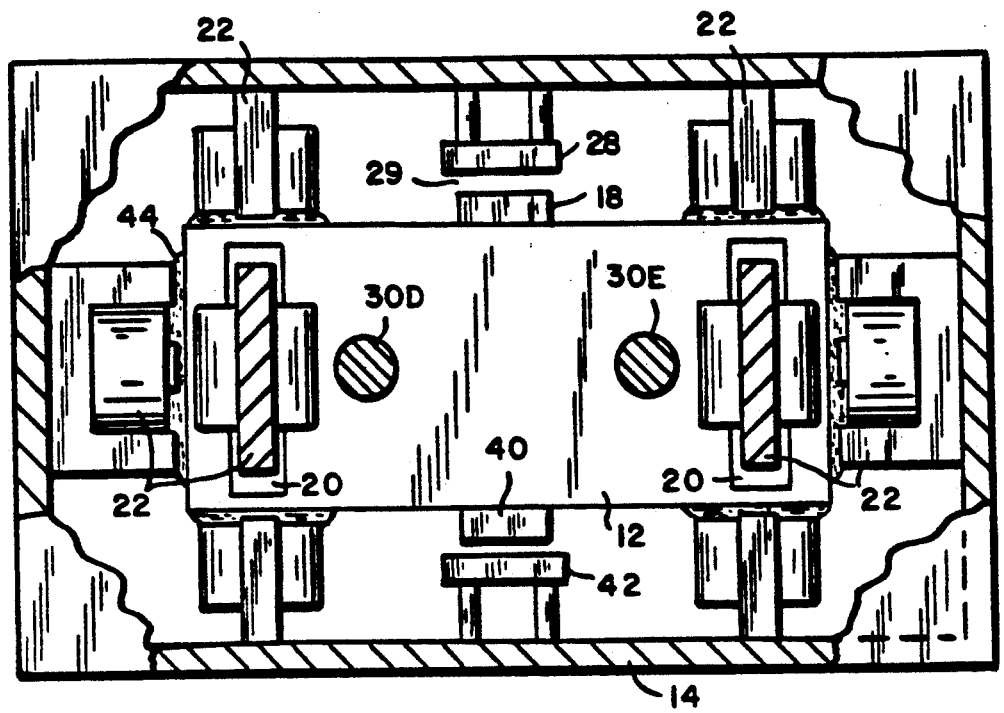
FIG. 3 is a partially broken away end view of a bearing of the type shown in FIG. 1 with two modifications.

FIG. 3 is an end view of a bearing of this invention which illustrates two variations on the embodiment of FIGS. 1 and 2. First, for the earlier embodiments, the weight of the platen is supported solely by the attraction of magnet 18 to iron bar 28. In FIG. 3, this support for the weight of the platen is supplemented by a magnet or magnets 40 secured to the bottom of the platen and a second magnet 42 of polarity opposite to that of magnet 40 mounted to frame 14 opposite each magnet 40. Where two magnets 18 are employed, as shown in FIGS. 1 and 2, it is preferable that two magnets 40 also be employed which are positioned on the opposite side of platen 12 from the magnets 18. The repulsive force between magnets 40 and 42 further serves to support the gravitational weight of platen 12. While both an attractive and repulsive arrangement are shown in FIG. 3 for supporting the weight of the platen, two magnets connected to operate in a repulsive mode may be used alone to support the weight of the platen.

Second, in FIG. 3, the spaces 26 between the electromagnetics and platen 12 are shown filled with a fluid 44. This is done because air has relatively poor damping characteristics, and damping of platen movement caused by vibration or other perturbations on the platen can thus be enhanced by providing an oil or other damping fluid in spaces 26. While not specifically shown in FIG. 3, optimum damping can be obtained by immersing the entire platen or substantially the entire platen in the damping fluid. However, enhanced damping also results in increased response time for the system in applications where the system is being used as a small motion controller, and it may, therefore, be desirable to reduce the amount of damping fluid utilized in such applications.

It is also possible to use ferrofluid as the fluid 44. When this is done, iron inserts 20 may be dispensed with, movement of the platen being controlled by applying current or additional current to selected electromagnets 22 to attract additional ferrofluid into the gap between such electromagnet and the platen. The controlled flow of ferrofluid into the gap exerts a pushing force on the platen to effect the desired motion thereof. With ferrofluid as the fluid 44, it may be necessary to maintain a small current in electromagnets 22 to maintain the ferrofluid in the gaps. Ferrofluid in the gaps may also be used to supplement rather than to replace motion control resulting from the interaction of the electromagnet and the iron inserts. If other fluid is utilized and the entire platen is not immersed in the fluid, some other mechanism known in the art may be required to retain the fluid in the gaps.

Figure 4:
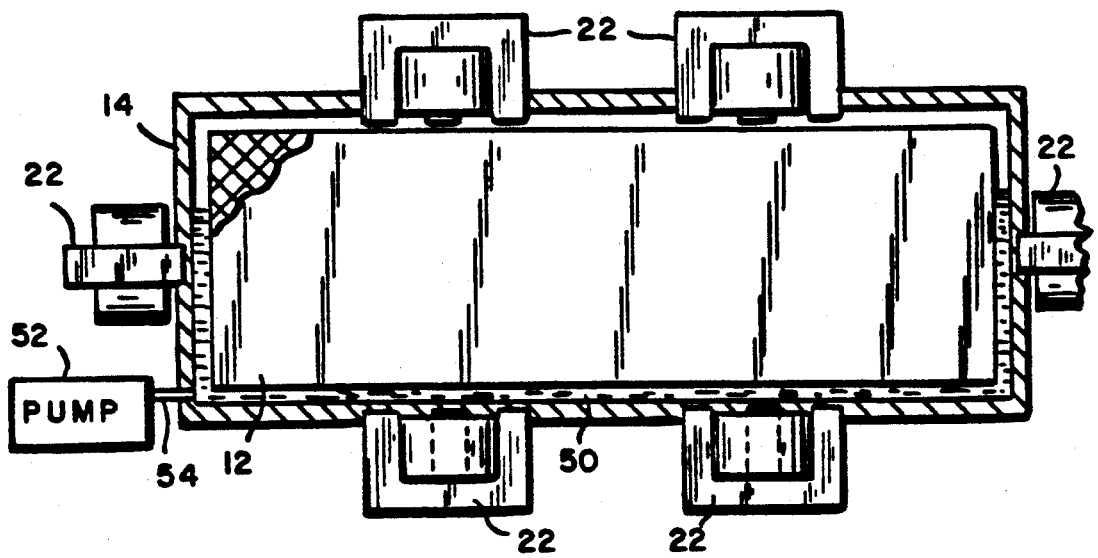
FIG. 4 is a sectional side view of a bearing of the type shown in FIG. 1 with an additional modification.

FIG. 4 illustrates still another variation on the invention wherein frame 14 is a solid chamber at least for the lower portion thereof which is filled to a predetermined level with a viscous fluid 50 such as oil. The average density of the fluid is greater than the average density of the material forming platen 12 so that the platen floats at a predetermined and controllable level in frame 14. The weight of the platen is thus completely supported by fluid 50 and attractive or repulsive permanent magnets such as the magnets 18, 40 and 42 ar not required to support the weight of the platen. Except for this difference, the embodiment of FIG. 4 functions in the same manner indicated for the previous embodiments.

Figure 5:
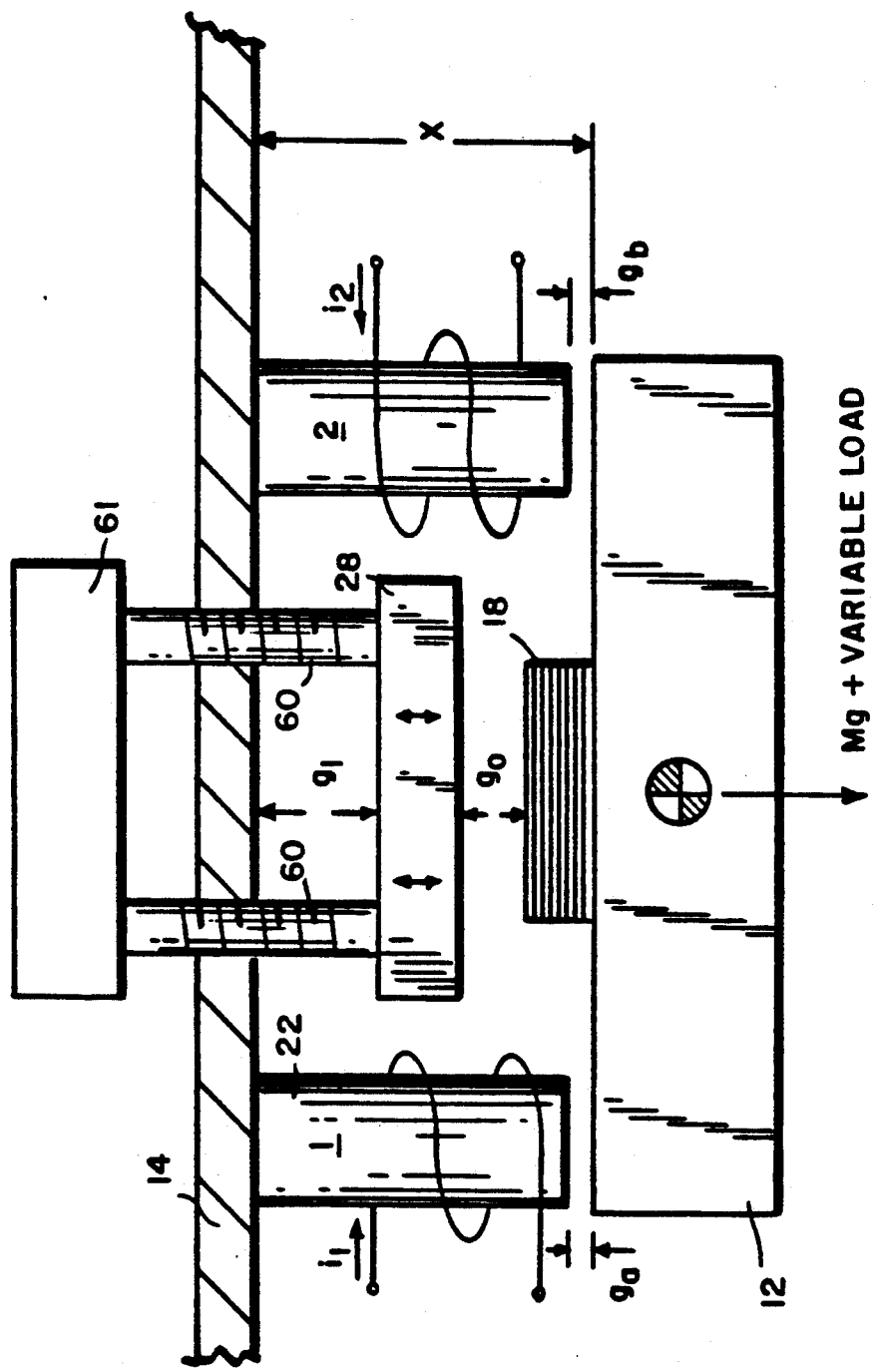
FIG. 5 is a sectional side view of a portion of a bearing of the type shown in FIG. 1 with a still further modification.

FIG. 5 illustrates another variation on the embodiment shown in FIG. 1 which permits the weight of platen 12 to be supported by magnet 18 and iron bar 28 regardless of changes which may occur in the weight of the platen. Thus, where the platen is, for example, being utilized for controlled positioning of a semiconductor device, placing the semiconductor material to be operated on in sample mounting area 16 will result in a predetermined increase in the weight of platen 12. Normally, this additional weight would be carried by increasing the current flow in the electromagnets 22 above the platen to restore the platen to its initial position and maintain it therein. If the weight of the platen were reduced, current would flow in the electromagnets below the platen to restore equilibrium. However, having current flowing in the electromagnets over an extended period of time results in increased current usage and thus increases the operating costs of the system. It also results in heat being generated which must be dissipated in order to avoid thermal induced errors which can become significant when operating in the nanometer range. Finally, current continuously flowing in some of the electromagnets reduces the flexibility of the system to respond to movement perturbations. It is, therefore, desirable that the weight of the platen be at all times supported solely by the permanent magnet or magnets regardless of changes in platen weight.

Therefore, for the embodiment of FIG. 5, metal plate 28 is mounted to frame 14 by lead screws 60, a rack and pinion or other suitable means which permit the spacing between metal plate 28 and frame 14 ($g_1$) to be altered, thus altering thegap $g_0$ between permanent magnet 18 and metal plate 28. Varying the gap $g_0$ varies the magnetic force between magnet 18 and plate 28. Therefore, if the weight of platen 12 is varied, the lead screws 60 or other suitable means may be operated by a suitable drive mechanism 61 to vary gap $g_0$ in an appropriate direction so that the magnetic force between magnet 18 and plate 28 is again sufficient to support the new weight of platen 12. Where two magnets 18 and two plates 28 are employed, the gaps $g_0$ for both magnets would be concurrently adjusted. While typically the adjustments for both magnets would be the same, they may be different in situations such as where the load is placed off center on the platen requiring a torque correction.

Figure 7:
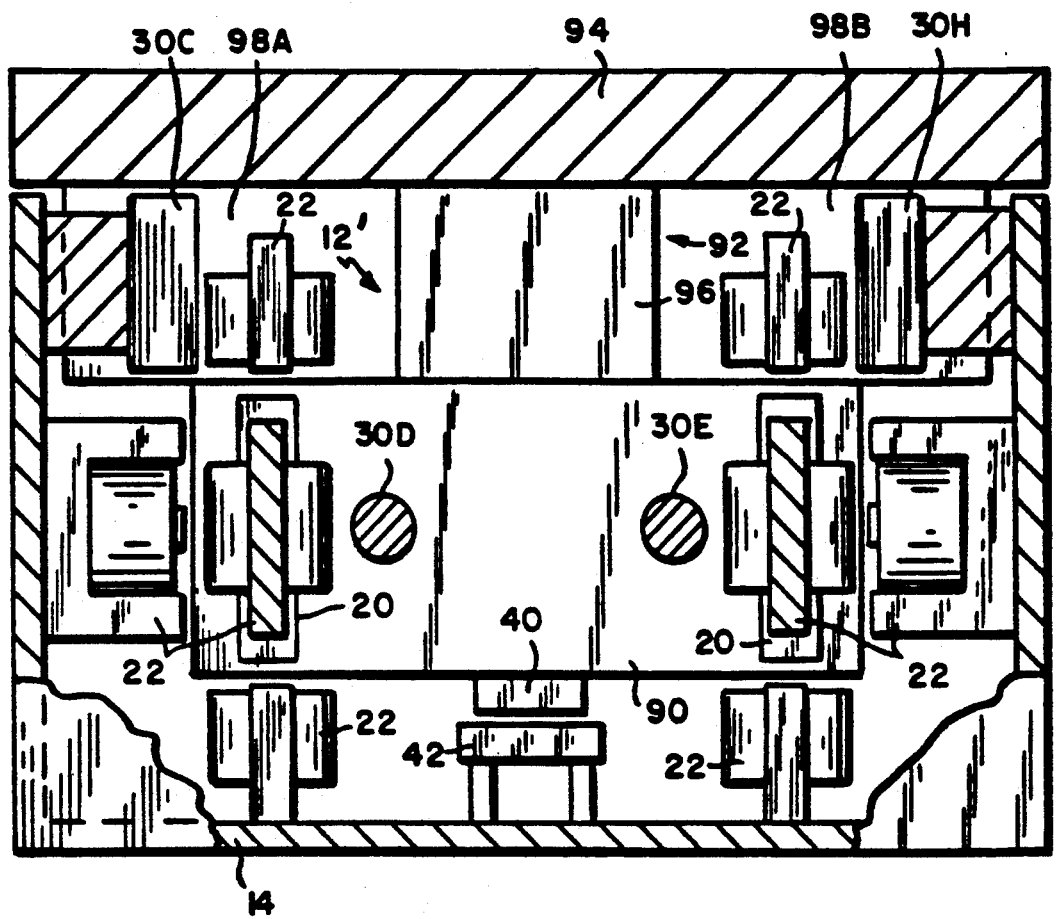
FIG. 7 is a partially cut away side view of an embodiment of the invention which provides unobstructed access to a work surface on the top of the platen.

While FIG. 5 shows the adjustment being made for a magnet and plate operating in an attractive mode, where magnets 40 and 42 are utilized (FIG. 3), either in conjunction with a magnet and bar operating in the attractive mode as shown in FIG. 3 or alone as shown in FIG. 7, the position of permanent magnet 42 could be adjusted in the same way as the position of metal plate 28 is adjusted to compensate for variations in platen weight. Similarly, for the embodiment of the invention shown in FIG. 4, the quantity of fluid 50 in housing 14 could be adjusted by pumping a precise known quantity of the fluid into or from the chamber to maintain the desired position for the platen with changes in weight. A pump 52 connected to chamber 14 by a tube 54 is shown in FIG. 4 for accomplishing this function.

While the adjustments of lead screws 60 or of pump 52 could be accomplished manually, it is preferable that such adjustments be made automatically in response to changes in the platen weight. In general, this may be accomplished by detecting when current is applied to electromagnets 22 which are utilized to move the platen in the vertical or X direction (FIG. 1) and by adjusting the gap $g_0$ so as to zero out such currents. Referring to the figures, the electromagnets for which current would be zeroed out are the four electromagnets adjacent the top face of the platen and the four electromagnets adjacent the bottom face of the platen.

Figure 6:
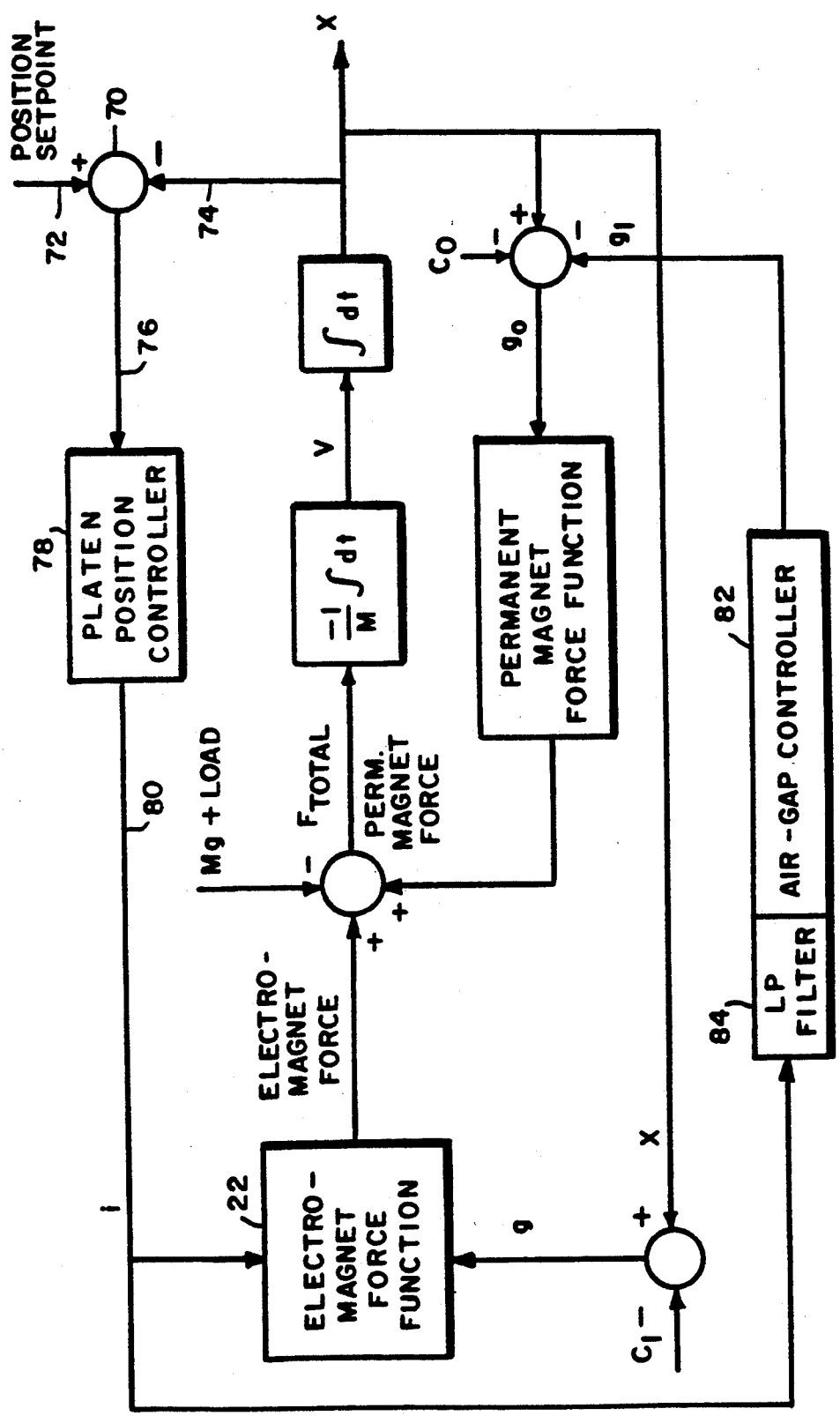
FIG. 6 is a schematic block diagram of a circuit suitable for use in controlling the device shown in FIG. 5.

FIG. 6 illustrates how the gap adjustment operation is performed. Referring to this figure, a signal indicative of set point position is normally applied to a summing circuit 70 over a line 72. This is true for all of the position controllers, not just the position controller in the X direction. The signal on line 72 may be from a suitable control processor, may result from manual inputs or may be obtained in other ways known in the art. The other input to circuit 70 is a signal on line 74 which is indicative of the current position of the platen. This is, for example, obtained from the detectors 30A-30F and in particular the detectors 30A, 30B and 30C shown in FIG. 2. Any difference between the actual set point position and the desired set point position results in an output on line 76 which is applied to a platen position controller 78 to cause a signal having a desired current on line 80. Circuit 78 may not be required if circuit 70 generates an output, the current of which is a function of the difference between its inputs. If the inputs to circuit 70 are digital, resulting in a digital output on line 76, circuit 78 could be a digital to analog converter which might include a RAM or ROM for converting digital input values to appropriate digital current values inputted to the D/A converter.

The current on line 80 performs two functions. First, the current is applied to appropriate electromagnets 22 to restore the platen to the set point position. With the electromagnets connected in push/pull fashion, this would normally involve applying current to either all four electromagnets on top of the platen or all four electromagnets below the platen, depending on the direction in which the platen is to be moved. Different currents could be applied to both sets of electromagnets to provide a damped, controlled motion.

The current i is also sensed by an air gap controller 82. Air gap controller 82 preferably includes low pass filter 84 or a threshhold circuit so that adjustment of air gap $g_0$ does not occur for perturbations in platen position in the X direction which are compensated for by the electromagnets and only occurs for sustained currents caused by weight changes in the platen which exist for some duration. The low pass filter would respond only to sustained currents i while a threshhold circuit may, for example, include a capacitor which is charged by the current signal on line 80 and discharges quickly when there is no current signal on line 80. A signal would be provided to the controller operating the set screw or other mechanism for adjusting gap $g_0$ only when the capacitor had charged to a predetermined level, meaning that the current (i) was present for a selected sustained duration.

The remainder of FIG. 6 functionally indicates what is happening in the system, but does not necessarily indicate particular hardware. For example, the force generated by the permanent magnet is determined by gap $g_0$, which gap is equal to the X position of the platen top face from frame 14, minus the space between the metal plate 28 and the frame ($g_1$), minus a constant ($C_0$) which is a function of the thickness of the permanent magnet and the metal plate. Similarly, the force generated by the electromagnet is a function of the electromagnet gap g, which gap is equal to X minus a constant C1 which is a function of the thickness of the electromagnet (i.e. the distance the electromagnet projects from the frame). The total force acting on the platen is the electromagnet force, plus the permanent magnet force, less the force of gravity acting on the mass of the platen and of any additional load thereon. This force integrated over time and divided by the mass gives velocity. The velocity integrated over time gives X position. For FIG. 6, with corrections being made in only the X direction or degree of freedom, $i_1 = i_2 = i$ (FIG. 5) and $g_a = g_b = g$. Where corrections are being made for more degrees of freedom, this would not be the case and additional control circuits would be required.

Figure 8:
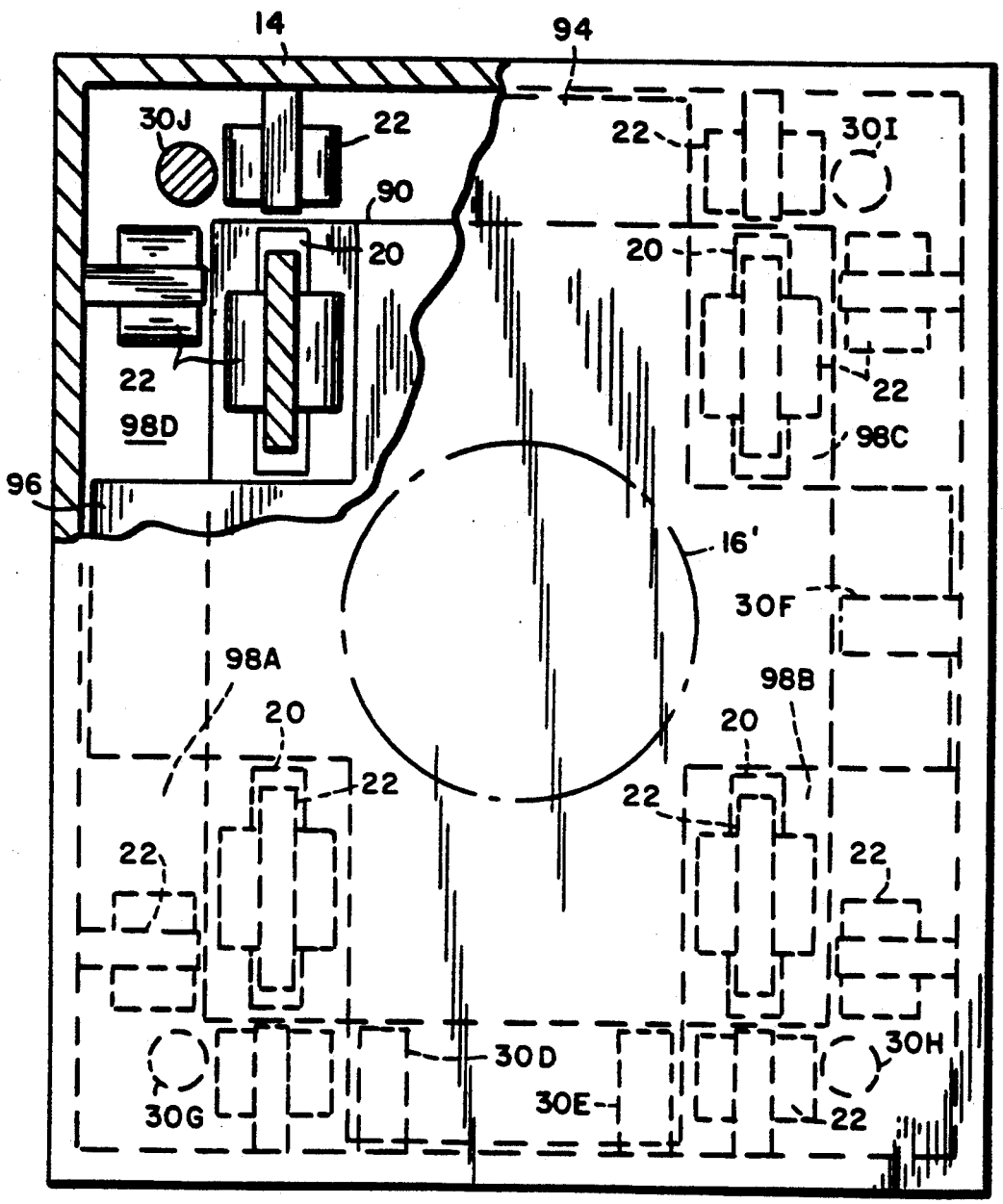
FIG. 8 is a partially cutaway top view for the embodiment of the invention shown in FIG. 7.

FIGS. 7 and 8 illustrate still another embodiment of the invention which differs from the embodiments previously shown, for example that of FIG. 1, primarily in that a much larger unobstructed sample mounting area 16' is provided by forming the platen 12' in two portions, a main portion 90 and a platform portion 92. Platform portion 92 has a top platform 94 and a base 96 with cut out corners 98A–98D.

Main portion 90 of the platen corresponds to the platen 12. Permanent magnets 40 and 42 function in the same manner as for the embodiment shown in FIG. 3 to support the weight of the platen 12', including both main portion 90 and platform portion 92. For the embodiment of FIG. 7, the weight of the platen is supported solely by the magnet operating in repulsive mode rather than having the support supplemented by a magnet and iron bar on top of the platen acting in attractive mode.

Similarly, the electromagnets on the bottom, sides and ends of main portion 90 function in identical manner to the ways these elements function for the prior embodiments and capactive probes 30D, 30E and 30F positioned on the ends and sides, respectively, of the main platen portion function in an identical manner to the way in which these probes function for the earlier embodiments. However, for this embodiment of the invention, there is an electromagnet 22 mounted in each of the cutouts 98. These electromagnets perform the same function as the corresponding electromagnets in the embodiment of, for example, FIG. 1, but are mounted to the side of the frame rather than to the top of the frame. Further, capacitive probes 30A, 30B and 30C mounted to the top of the frame are replaced by four capacitive probes 30G, 30H, 30I and 30J which are mounted to the frame side wall adjacent cutouts 98A, 98B, 98C and 98D, respectively. Capacitive probes 30I and 30J basically perform the function of capacitive probe 30A for making pitch determinations and supplement the other capacitive probes for roll and translational movement in the X direction determinations. Platform 94 extends at least slightly above the side walls of housing 14 to provide an unobstructed top work surface.

The device of this invention may be utilized to maintain precise positioning for a semiconductive chip or other workpiece on which operations with a high degree of positional accuracy are to be performed. By applying suitable currents to, for example, the electromagnets on either end of platen 12, the device may also be utilized for small position movement in applications such as semiconductor chip fabrication. For example, in a typical application, it might be possible to move the platen 250 microns in any direction, i.e. a distance slightly less than the spacing of the air gaps 26 for the electromagnets and the comparable air gaps for the capacitive probes, with nanometer resolution.

Figure 9:
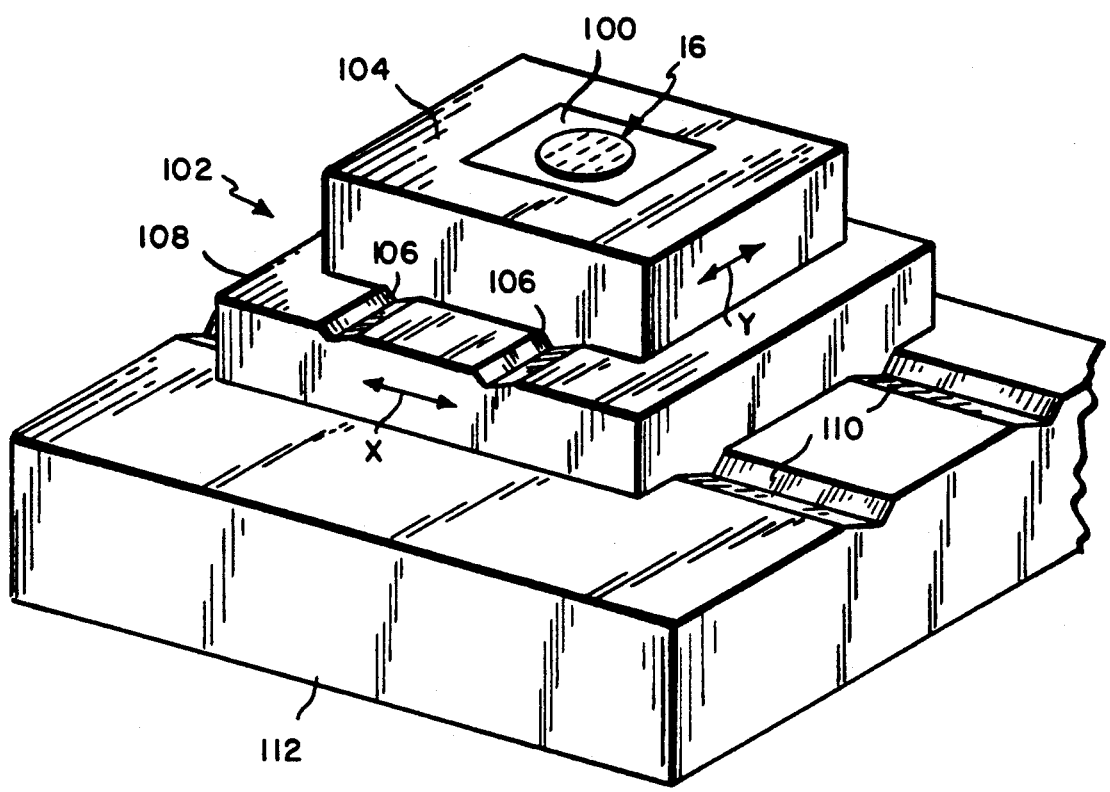
FIG. 9 shows a device of the type shown in FIGS. 7 and 8 being utilized as a fine position stage in a semiconductor positioning mechanism.

As illustrated in FIG. 9, the device of this invention may also be utilized as a fine positioning stage 100 in a positioning system 102 with standard mechanisms being utilized to effect the coarse positioning. For example, fine positioning stage 100 may be mounted in a standard coarse Y-positioning stage 104 moving in V grooves 106 in a standard coarse X-positioning stage 108. Stage 108 might in turn ride in V-grooves 110 in machine base 112. Again, assuming semiconductor chip manufacture, the coarse positioning may be utilized to move from element-to element when exposing a photosensitive surface for semiconductor fabrication, with the fine positioning mechanism being utilized to effect movements within a single element.

While for the various embodiments discussed above, six degrees of freedom have been shown, it is apparent that the system may operate with lesser or greater degrees of freedom. For example, a system operating in polar coordinates might have two or three degrees of freedom. Conversely, to the extent the platen may bend, additional detection and correction may be required for this mode. There may also be a need to detect and correct for various vibrational modes.

While the invention has been illustrated above with respect to a number of different embodiments, and a number of variations for each of the embodiments have been discussed above, it is to be understood that the various embodiments are shown for purposes of illustration and that the foregoing and other changes in form and detail may be made by one skilled in the art while still remaining within the spirit and scope of the invention.

What is claimed is:

1. A bearing comprising:
a platen having a predetermined effective weight;
a frame in which said platen is positioned; and means for suspending said platen in a predetermined position in said frame, said suspending means including permanent magnet means having a first gap for carrying the effective weight of the platen, electromagnet means having a second gap for controlling the position of the platen in the frame with N degrees of freedom, where N is an integer of at least one, said first gap being larger than said second gap, means for detecting the position of the platen in the frame in said N degrees of freedom, and means responsive to the detection by the detecting means of a movement by the platen from the predetermined position for selectively energizing said electromagnet means to restore the platen to the predetermined position.

2. A bearing as claimed in claim 1 including damping means present in at least selected ones of said air gaps to improve damping and high frequency coupling between the frame and platen.

3. A bearing as claimed in claim 2 wherein said damping means is a viscous fluid.

4. A bearing as claimed in claim 2 wherein said damping means is a ferrofluid.

5. A bearing as claimed in claim 4 wherein when said electromagnet means are selectively energized, ferrofluid is selectively attracted to the corresponding second gaps, varying the force applied to the platen to thereby move the platen.

6. A bearing as claimed in claim 1 wherein said permanent magnet means includes at least one permanent magnet, and an iron sheet for each permanent magnet positioned adjacent the magnet an spaced therefrom by said first air gap, either the magnet or iron sheet being fixed to the top of the platen and the other being fixed to the frame 7. A bearing as claimed in claim 6 wherein said permanent magnet means also includes at least one first permanent magnet fixed to the bottom of the platen, and a second permanent magnet fixed to the frame adjacent each first permanent magnet and spaced therefrom by said first air gap, said first and second permanent magnets being poled to repel each other.

8. A bearing as claimed in claim 1 wherein said permanent magnet means includes at least one first permanent magnet fixed to the bottom of the platen, and a second permanent magnet fixed to the frame adjacent each first permanent magnet and spaced therefrom by said first air gap, said first and second permanent magnets being poled to repel each other.

9. A bearing as claimed in claim 1 wherein the platen is controlled in L linear degrees of freedom and in R rotational degrees of freedom, where L and R are integers of at least one, and
wherein said electromagnet means includes at least one electromagnet for each linear degree of freedom and at least one additional electromagnet for each rotational degree of freedom.

10. A bearing as claimed in claim 9 wherein L and R are both equal to three; and wherein said electromagnet means includes at least two electromagnets on opposite sides of the platen for each linear degree of freedom which electromagnets operate in push pull fashion, and at least two additional electromagnets on opposite sides of the platen for each rotational degree of freedom.

11. A bearing as claimed in claim 10 wherein said platen has a main portion and a platform portion, said platform portion having a top which is not covered by the frame; and
wherein said electromagnets are positioned adjacent and operate on said main portion.

12. A bearing as claimed in claim 11 wherein said platform portion has a base with at least open corners and a top platform over the base; and
wherein there is an electromagnet fixed to a side of the frame in each of said base corners, said electromagnets acting on the top of the main platen portion, and an electromagnet positioned opposite each of the corner mounted electromagnets and operating on the bottom of said main portion.

13. A bearing as claimed in claim 1 wherein said platen has four sides, a top and a bottom, all of which are generally flat and substantially rectangular, the area of said top and bottom being substantially larger than the area of said sides;
wherein N is six; and
wherein said electromagnet means includes at least one electromagnet positioned on two opposite sides of the platen, at least two electromagnets positioned on each of the other two sides of the platen on opposite sides of a top/bottom center line for said sides, and four electromagnets positioned adjacent said top and said bottom, each of the four electromagnets being in a different quadrant defined by center lines drawn through the top and bottom, electromagnets on opposite sides and on the top and bottom being positioned opposite each other, each of said electromagnets being spaced from the platen by said second air gap.

14. A bearing as claimed in claim 13 wherein there is an iron insert embedded in said platen adjacent each of said electromagnets.
wherein said electromagnet means includes at least one iron insert embedded in said platen on two opposite sides thereof, at least two iron inserts embedded in said platen on each of the other two sides thereof on opposite sides of a top/bottom center line for said sides, and four iron inserts embedded in said top and in said bottom, each of the four iron inserts being in a different quadrant defined by center lines drawn through the top and bottom, iron inserts on opposite sides and on the top and bottom being positioned opposite each other, and an electromagnet in said frame adjacent each of said iron inserts and spaced therefrom by said second air gap.

15. A bearing as claimed in claim 14 wherein each of said iron inserts is slightly larger than the corresponding electromagnet to permit constant magnetic coupling to be maintained over the full permitted range of movement of the platen in the frame.

16. A bearing as claimed in claim 14 wherein there is an iron insert near each end of each of the platen sides and near each corner of the platen top and platen bottom.

17. A bearing as claimed in claim 13 including means for selectively energizing one or more of said electromagnets to effect fine motion control of said platen in a given degree of freedom.

18. A bearing as claimed in claim 13 wherein all of said electromagnets are substantially identical.

19. A bearing as claimed in claim 13 wherein there is ferrofluid at least in the second air gap between each electromagnet and the platen.

20. A bearing as claimed in claim 1 wherein said platen is a hollowed-out cellular structure of a magnetically non-permeable material which is light, stiff, has a low thermal expansion and has good damping characteristics.

21. A bearing as claimed in claim 20 wherein said material is a composite material.

22. A bearing as claimed in claim 1 wherein said means for detecting includes at least one detection probe for each of said degrees of freedom, such probes being mounted to the frame and spaced from the platen, at least one of said probes being positioned to detect movement in each lateral direction of motion, at least two of said probes being positioned to detect each of roll, pitch and yaw.

23. A bearing as claimed in claim 22 wherein said probes are capacitive probes.

24. A bearing as claimed in claim 22 wherein said probes are optical interferometers.

25. A bearing as claimed in claim 22 wherein said probes are induction probes.

26. A bearing as claimed in claim 1 wherein said electromagnet means includes means for effecting fine motion control of said platen in a given degree of freedom.

27. A bearing as claimed in claim 26 wherein said bearing is a fine motion control in an element positioning system; and
   including means for performing coarse motion control in said given degree of freedom.

28. A bearing comprising:
   a platen of predetermined effective weight having a hollowed-out cellular structure and formed of a magnetically non-permeable material which is light, tiff, has a low thermal expansion and has good damping characteristics;
   a frame in which said platen is positioned; and
   means for suspending said platen in a predetermined position in said frame, the suspending means including first means for carrying the effective weight of the platen, second means for controlling the position of the platen in the frame with N degrees of freedom, where N is an integer of at least one, means for detecting the position of the platen in the frame in said N degrees of freedom, and means responsive to the detection by the detecting means of a movement by the platen from the predetermined position for selectively energizing said second means to restore the platen to the predetermined position.

29. A bearing as claimed in claim 28 wherein said material is a composite material.

30. A bearing as claimed in claim 28 wherein said bearing has a honeycomb structure.

* * * * *